United States Patent
Yang (10) Patent No.: US 6,720,653 B2
(45) Date of Patent: Apr. 13, 2004

(54) METAL LAYER IN SEMICONDUCTOR DEVICE INCLUDING A PLANAR STUFFED LAYER AND AN INSULATING FILM WITH A PROJECTION AND METHOD FOR FABRICATING THE SAME

(75) Inventor: Dae Gun Yang, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/987,743

(22) Filed: Nov. 15, 2001

(65) Prior Publication Data

US 2002/0048936 A1 Apr. 25, 2002

Related U.S. Application Data (62) Division of application No. 09/696,200, filed on Oct. 26, 2000, now Pat. No. 6,352,877.

(51) Int. Cl.⁷ .............................................. H01L 23/52
(52) U.S. Cl. ...................... 257/750; 257/774; 257/752
(58) Field of Search ................................. 257/752, 774, 257/773, 750, 758, 701, 700

(56) References Cited

U.S. PATENT DOCUMENTS

| | | |
|---|---|---|
| 5,111,034 A | 5/1992 | Takagi |
| 5,514,616 A | 5/1996 | Rostoker et al. |
| 5,616,519 A | 4/1997 | Ping |
| 5,728,591 A | 3/1998 | Takahashi et al. |
| 5,733,713 A | 3/1998 | Yano et al. |
| 5,783,481 A | 7/1998 | Brennan et al. |
| 5,895,226 A | 4/1999 | Baba et al. |
| 6,010,957 A | 1/2000 | Gardner et al. |
| 6,080,988 A | 6/2000 | Ishizuya et al. |
| 6,287,956 B2 | 9/2001 | Yokoyama et al. |
| 2002/0053741 A1 * | 5/2002 | Iwasaki et al. ............. 257/762 |
| 2002/0072223 A1 * | 6/2002 | Gilbert et al. ............. 438/629 |

FOREIGN PATENT DOCUMENTS

| | | |
|---|---|---|
| DE | 019620645 | 12/1996 |
| JP | 01-227435 | 9/1989 |

OTHER PUBLICATIONS

Colgan et al., "On–Chip Metallization Layers For Reflective Light Valves", May/Jul. 1998 IBM J. Res. Develop. vol. 42, No. 3/4, pp. 339–345.

* cited by examiner

*Primary Examiner*—Nathan J. Flynn
*Assistant Examiner*—Pershelle Greene
(74) *Attorney, Agent, or Firm*—Morgan, Lewis & Bockius LLP

(57) ABSTRACT

Metal layer in a semiconductor device and method for fabricating the same, the semiconductor device having a transistor and a capacitor electrode formed on a region of a semiconductor substrate, the metal layer including a planar protection film on an entire surface of the semiconductor substrate inclusive of the transistor and the capacitor electrode, an absorber layer over the planar protection film inclusive of a region over the transistor, an insulating film on an entire surface, with a width of projection in a relievo form in a region over the absorber layer, a via hole through the planar protection film and the insulating layer, to expose a region of the capacitor electrode, a tungsten plug and a planar stuffed layer in the via hole, a mirror metal layer on the insulating film on both sides of the projection of a relievo form of the insulating film, inclusive of the planar stuffed layer, and an insulating film spacer on the projection of a relievo form of the insulating film and the mirror metal layer in the vicinity of the projection, whereby improving a light transmission ratio and enhancing an optical contrast.

9 Claims, 8 Drawing Sheets

METAL LAYER IN SEMICONDUCTOR DEVICE INCLUDING A PLANAR STUFFED LAYER AND AN INSULATING FILM WITH A PROJECTION AND METHOD FOR FABRICATING THE SAME

This is a divisional of application Ser. No. 09/696,200 filed Oct. 26, 2000, now U.S. Pat. No. 6,352,877.

BACKGROUND OF THE INVENTION

1. Field of the Invention

The present invention relates to a semiconductor device, and more particularly, to a metal layer in a semiconductor device and a method for fabricating the same.

2. Background of the Related Art

Figure 1:
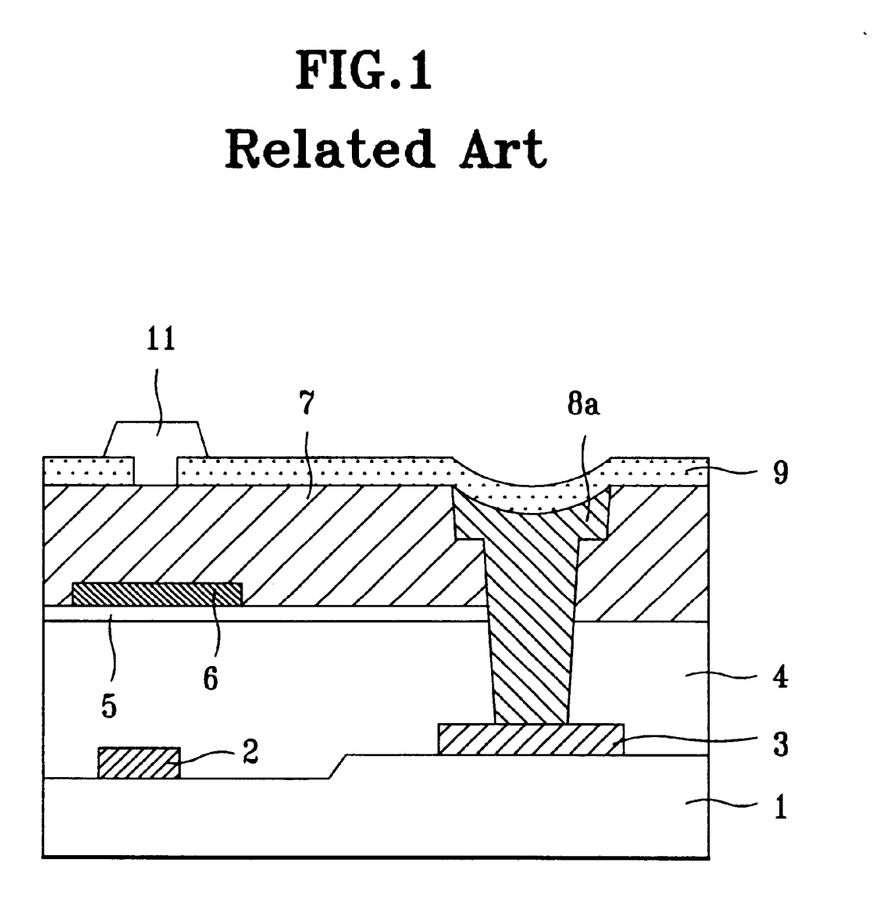
FIG. 1 illustrates a section showing a related art metal layer in a semiconductor device.
Figure 2A:
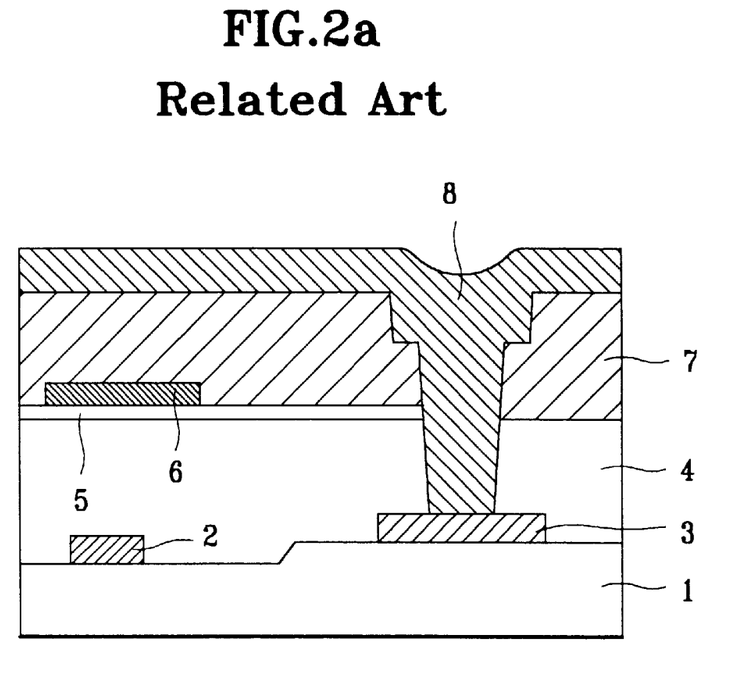
FIGS. 2A~2E illustrate sections showing the steps of a related art method for fabricating a metal layer in a semiconductor device.
Figure 2B:
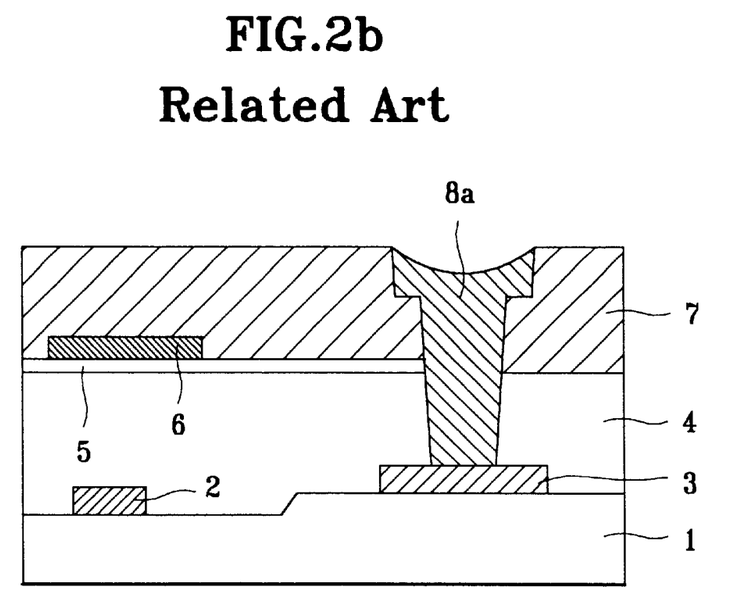
Figure 2C:
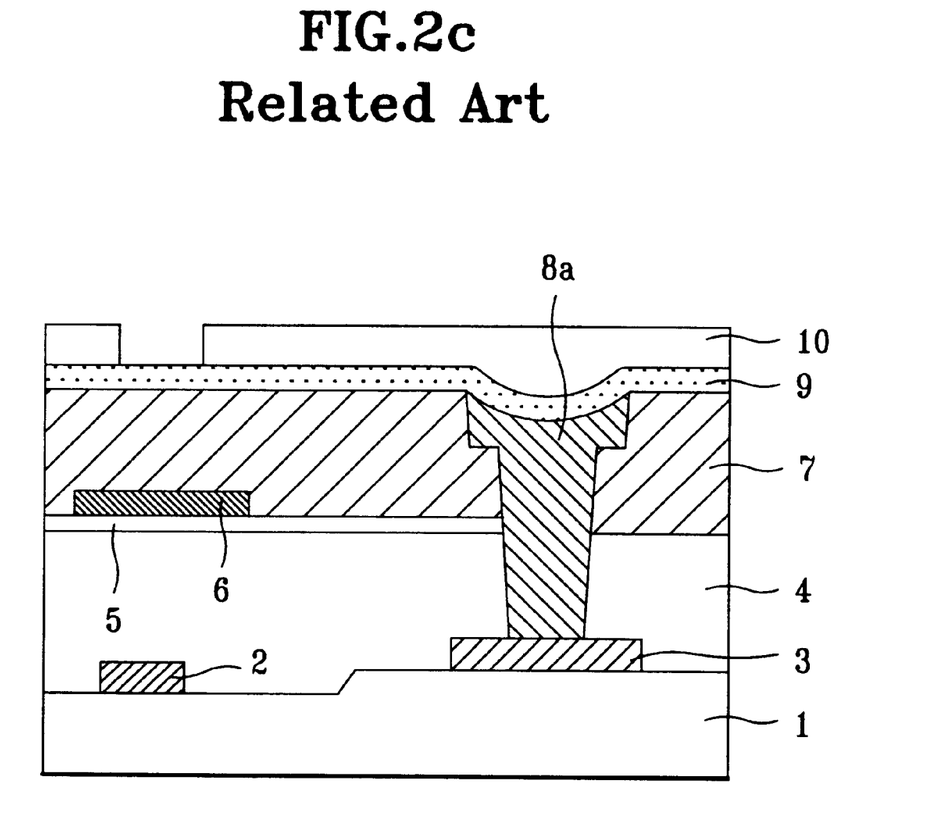
Figure 2D:
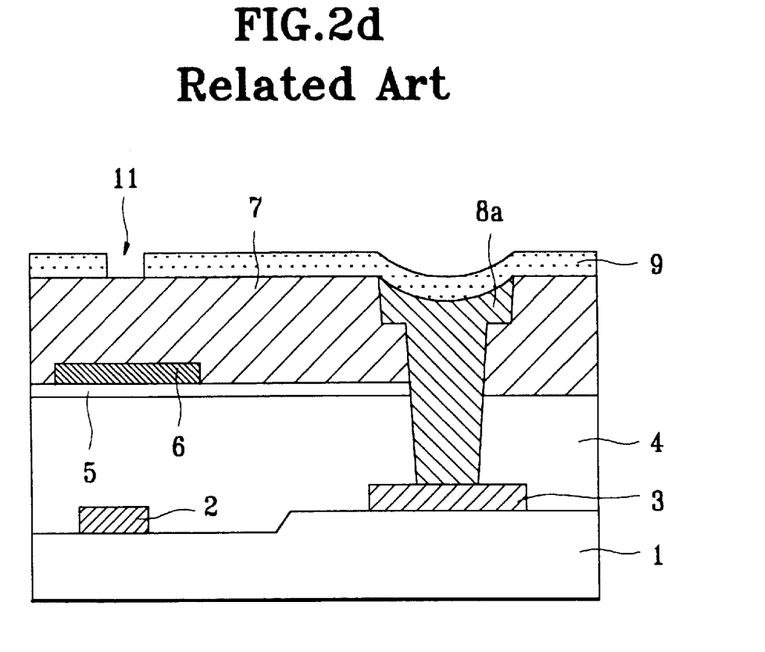
Figure 2E:
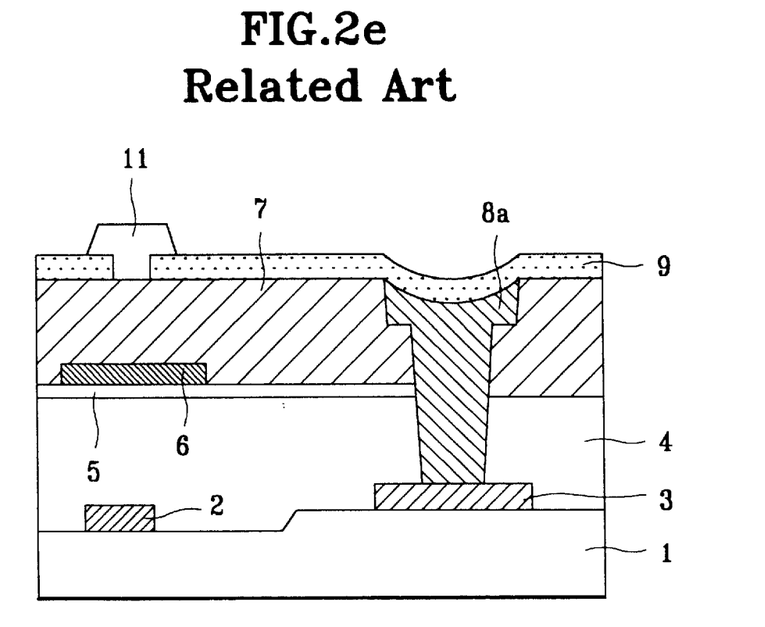

A related art metal layer in a semiconductor device and method for fabricating the same will be described with reference to the attached drawings. FIG. 1 illustrates a section showing a related art metal layer in a semiconductor device, and FIGS. 2A~2E illustrate sections showing the steps of a related art method for fabricating a metal layer in a semiconductor device.

Referring to FIG. 1, the related art metal layer in a semiconductor device is provided with an MOS transistor in a portion of an active region of a semiconductor substrate 1 having source/drain regions (not shown) and a gate electrode 2, and a capacitor electrode 3 of a metal in contact with the source region of the MOS transistor. There is a planar protection film 4 on an entire surface of the semiconductor substrate 1 having the MOS transistor and the capacitor electrode 3 formed thereon. And, there is an insulating layer 5 of silicon oxide on the planar protection film 4 inclusive of a region thereof over the gate electrode 2, and an absorber layer 6 of a metal on the insulating layer 5 inclusive of a region thereof over the gate electrode 2. The absorber layer 6 may be formed of a stack of layers of Al/Ti/TiN. There is a silicon nitride film 7 on an entire surface inclusive of the absorber layer 6 and the insulating layer 5. And, there is a via hole through the silicon nitride film 7, the insulating layer 5, and the planar protection film 4 to expose a region of the capacitor electrode 3. There is a tungsten plug 8a having a recess on a top thereof in the via hole. There is a mirror metal layer 9 on the silicon oxide film 7 and the tungsten plug 8a, with a gap at a region over the absorber layer 6. There is an oxide film spacer 11 in the gap of the mirror metal layer 9 and on the mirror metal layer 9 in the vicinity of the gap.

The related art method for fabricating the metal layer in a semiconductor device will be described.

Referring to FIG. 2, a planar protection film 4 is formed on an entire surface of a semiconductor substrate 1 provided with an MOS transistor in a portion of an active region of the semiconductor substrate 1 having source/drain regions(not shown) and a gate electrode 2, and a capacitor electrode 3 of a metal in contact with the source region of the MOS transistor. Then, a thin insulating layer 5 of silicon oxide ($SiO_2$) is deposited on the planar protection film 4. Layers of Al/Ti/TiN are stacked on the insulating layer 5, and subjected to anisotropy etching to leave the layers of Al/Ti/TiN only on a region of the insulating layer 5, to form an absorber layer 6. Next, a silicon nitride film 7 is deposited on an entire surface inclusive of the absorber layer 6 to a thickness in a range of 3000~4000 Å by PECVD (Plasma Enhanced Chemical Vapor Deposition). And, a first photoresist film (not shown) is coated on the silicon nitride film 7, and selectively patterned by exposure and development, until a portion of the photoresist film on the capacitor electrode 3 is removed. Then, the patterned first photoresist film is used as mask in etching the silicon nitride film 7, the insulating layer 5, and the planar protection film 4 in succession, to form a via hole over the capacitor electrode 3. Then, the first photoresist film is removed. A tungsten layer 8 is formed on the silicon nitride film 7 inclusive of the via hole by chemical vapor deposition. Then, as shown in FIG. 2B, the tungsten layer 8 is etched back by CMP (Chemical Mechanical Polishing), to form a tungsten plug 8a. In this instance, a problem is caused in that a thickness of the tungsten plug 8a is reduced by 500 Å more. As shown in FIG. 2C, a mirror metal layer 9 of aluminum is sputtered on the silicon nitride film 7 inclusive of the tungsten plug 8a to a thickness of 1500 Å. A second photoresist film is coated on the mirror metal layer 9, and selectively patterned to remove a portion thereof by exposure and development. The portion selectively removed is a portion under which a gap of the mirror metal layer 9 is to be formed. As shown in FIG. 2D, the patterned second photoresist film is used as a mask in subjecting the mirror metal layer 9 to anisotropic etching until the silicon nitride film 7 is exposed, for providing a gap of intaglio form in the metal layer 9. Then, the second photoresist film is removed. However, it is difficult to minimize the gap due to reflection at the mirror metal layer 9 when the mirror metal layer 9 is etched. Then, a silicon oxide film is deposited on an entire surface of the mirror metal layer 9, and removed by photo etching, to leave the silicon oxide film only in the gap in the mirror metal layer 9 and on the mirror metal layer 9 in the vicinity of the gap, to form an oxide film spacer 11.

However, the related art metal layer in a semiconductor device and method for fabricating the same have the following problems.

First, the difficulty in obtaining a minimized gap space caused by the use of photo etching in etching the mirror metal layer, with a reduction of mirror fill factor, results in difficulty in obtaining a high light transmission factor.

Second, the loss of the tungsten plug in the via hole, that impedes a complete planarization of the mirror metal layer, deteriorates an optical contrast.

Third, the formation of the tungsten plug by CMP causes damage to the silicon nitride film, that in turn causes a problem of forming a residual image in a light transmission, and pushes up production cost.

SUMMARY OF THE INVENTION

Accordingly, the present invention is directed to a metal layer in a semiconductor device and a method for fabricating the same that substantially obviates one or more of the problems due to limitations and disadvantages of the related art.

An object of the present invention is to provide a metal layer in a semiconductor device and a method for fabricating the same, which improves an optical transmission factor and an optical contrast.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the metal layer in a semiconductor device having a transistor and a capacitor electrode formed on a region of a semiconductor substrate includes a planar protection film on an entire surface of the semiconductor substrate inclusive of the transistor and the capacitor electrode, an absorber layer over the planar protection film inclusive of a region over the transistor, an insulating film on an entire surface, with a width of projection in a relievo form in a region over the absorber layer, a via hole through the planar protection film and the insulating layer, to expose a region of the capacitor electrode, a tungsten plug and a planar stuffed layer in the via hole, a mirror metal layer on the insulating film on both sides of the projection of a relievo form of the insulating film, inclusive of the planar stuffed layer, and an insulating film spacer on the projection of a relievo form of the insulating film and the mirror metal layer in the vicinity of the projection.

In another aspect of the present invention, there is provided a method for fabricating a metal layer in a semiconductor device having a transistor and a capacitor electrode formed on a region of a semiconductor substrate, including the steps of (1) forming a planar protection film on an entire surface of the semiconductor substrate inclusive of the transistor and the capacitor electrode, (2) forming an absorber layer over the planar protection film inclusive of a region over the transistor, (3) forming an insulating film on an entire surface, with a width of projection in a relievo form in a region over the absorber layer, (4) forming a via hole through the planar protection film and the insulating film, to expose the capacitor electrode, (5) forming a tungsten plug and a planar stuffed layer in the via hole, (6) forming a mirror metal layer on the insulating film on both sides of the projection of a relievo form of the insulating film, inclusive of the planar stuffed layer, and (7) forming an insulating film spacer on the projection of a relievo form of the insulating film and the mirror metal layer in the vicinity of the projection.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 3:
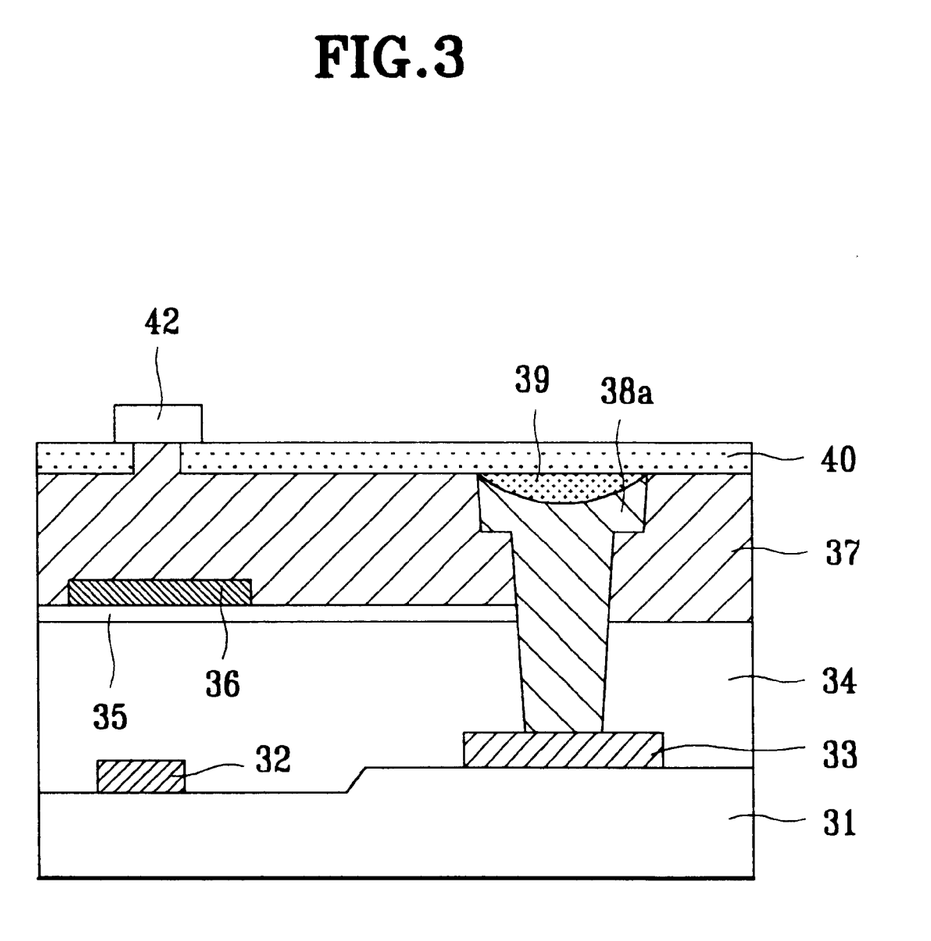
FIG. 3 illustrates a section showing a metal layer in a semiconductor device in accordance with a preferred embodiment of the present invention; and, FIGS. 4A~4E illustrate sections showing the steps of a method for fabricating a metal layer in a semiconductor device in accordance with a preferred embodiment of the present invention.

Reference will now be made in detail to the preferred embodiments of the present invention, examples of which are illustrated in the accompanying drawings. FIG. 3 illustrates a section showing a metal layer in a semiconductor device in accordance with a preferred embodiment of the present invention, and FIGS. 4A~4E illustrate sections showing the steps of a method for fabricating a metal layer in a semiconductor device in accordance with a preferred embodiment of the present invention.

Referring to FIG. 3, the metal layer in a semiconductor device in accordance with a preferred embodiment of the present invention includes an MOS transistor in a portion of an active region of a semiconductor substrate 31 having source/drain regions (not shown) and a gate electrode 32, and a capacitor electrode 33 of a metal in contact with the source region of the MOS transistor. There is a first planar protection film 34 on an entire surface of the semiconductor substrate 31 having the MOS transistor and the capacitor electrode 33 formed thereon. And, there is an insulating layer 35 of silicon oxide on the first planar protection film 34 inclusive of a region thereof over the gate electrode 32, and an absorber layer 36 of a metal on the insulating layer 35 inclusive of a region thereof over the gate electrode 32. There is a silicon nitride film 37 on an entire surface inclusive of the absorber layer 36 and the insulating layer 35. In this instance, the silicon nitride film 37 has a projection in a relievo form at a gap space portion of a mirror metal layer 40 to be formed later. The silicon nitride film 37 may be replaced with an oxide film. And, there is a via hole through the silicon nitride film 37, the insulating layer 35, and the first planar protection film 34 to expose a region of the capacitor electrode 33, there is a tungsten plug 38a the via hole, and there is a planar stuffed layer 39 on top of the tungsten plug 38a to stuff the via hole planar. The planar stuffed layer 39 is formed of SOG (Spin On Glass) solution in an inorganic group or FOX (Flowable Oxide) solution, or by chemical vapor deposition of oxide. And, there is a mirror metal layer 40 on the silicon nitride film 37 on both sides of the projection of the silicon nitride film 37, inclusive of the planar stuffed layer 39, such that the projection of the silicon nitride film 37 isolates the mirror metal layer 40 in two parts. The mirror metal layer 40 has a height the same with the projection and formed of aluminum which has a high reflection ratio. Then, an oxide film spacer of silicon oxide ($SiO_2$) is formed on an isolated portion of the mirror metal layer 40, i.e., on the projection.

The method for fabricating a metal layer in a semiconductor device in accordance with a preferred embodiment of the present invention will be described.

Figure 4A:
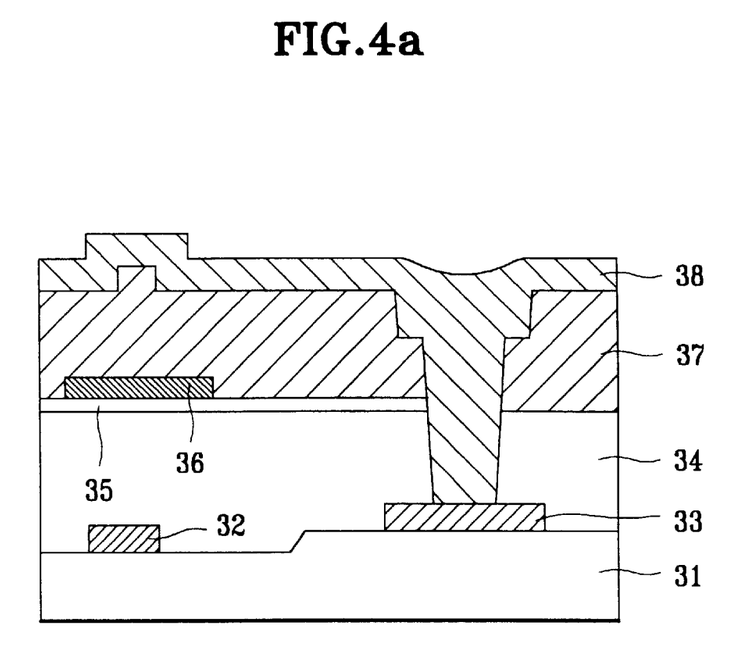
Figure 4B:
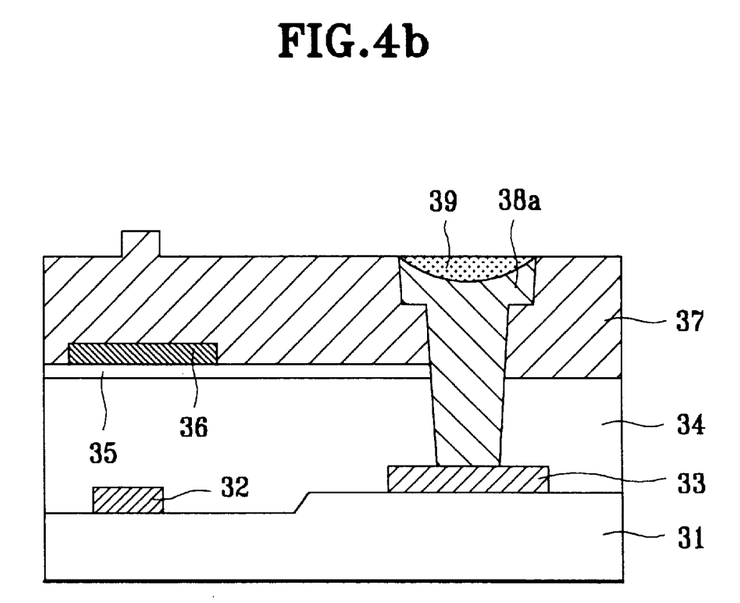
Figure 4C:
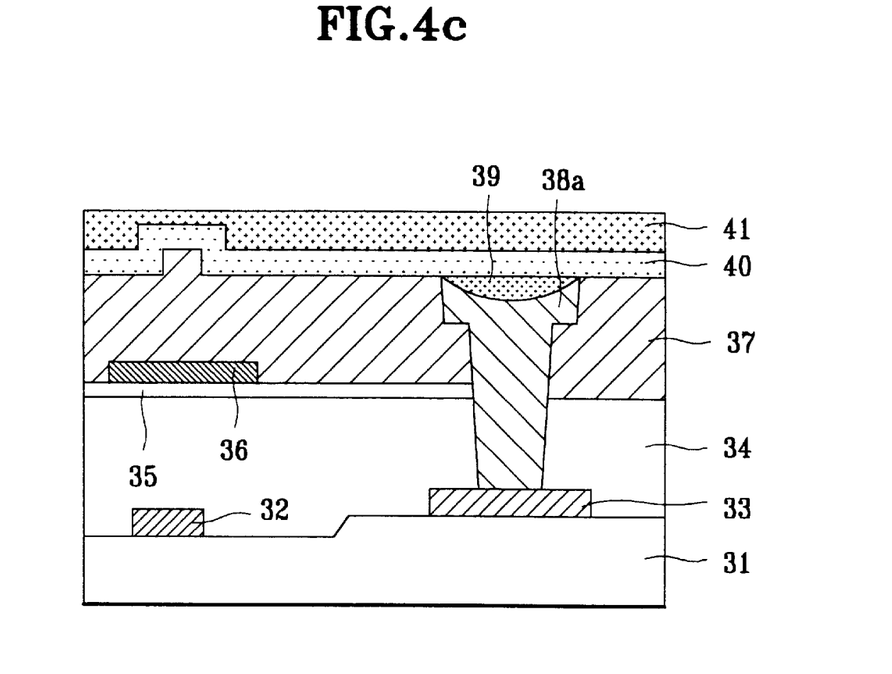
Figure 4D:
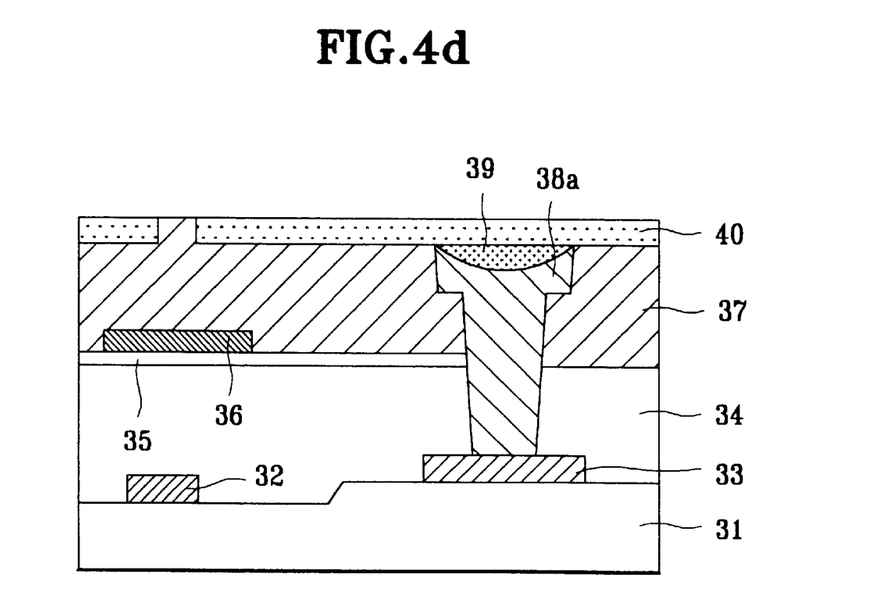
Figure 4E:
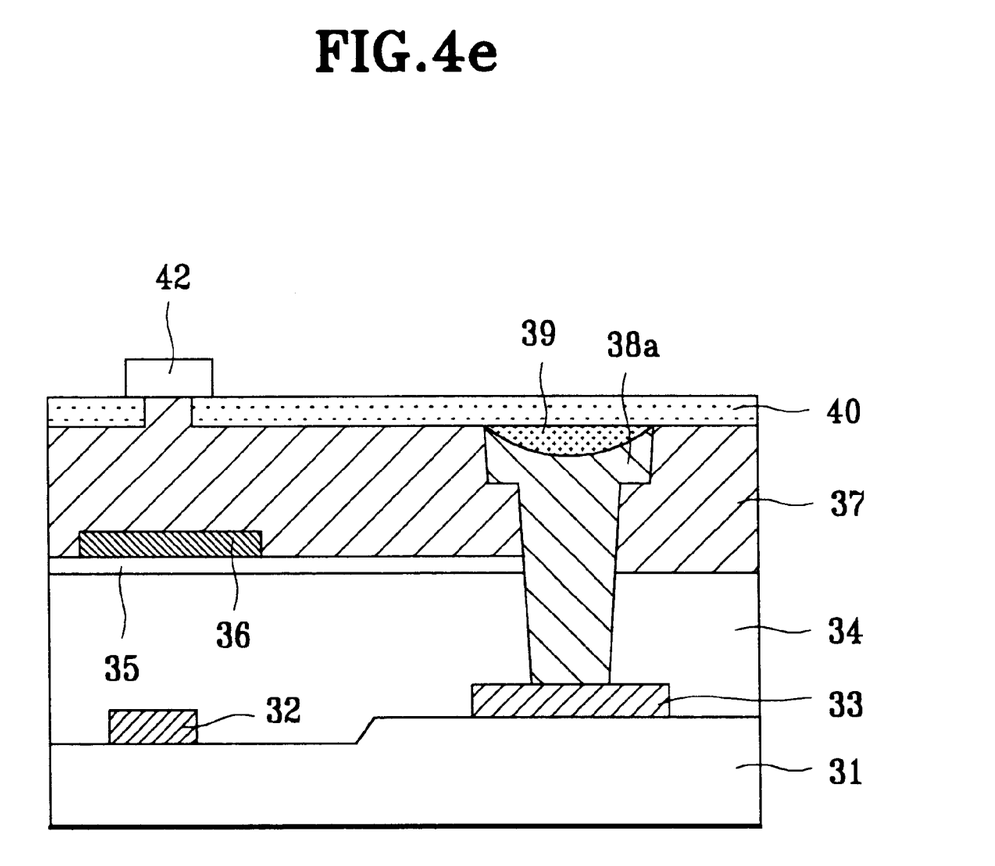

Referring to FIG. 4A, a first planar protection film 34 is formed on an entire surface of a semiconductor substrate 31 having an MOS transistor in a portion of an active region of the semiconductor substrate 31 with source/drain regions (not shown) and a gate electrode 32, and a capacitor electrode 33 of a metal in contact with the source region of the MOS transistor. Then, a thin insulating layer 35 of silicon oxide ($SiO_2$) is deposited on the first planar protection film 34. Layers of Al/Ti/TiN are stacked on the insulating layer 35, and subjected to anisotropic etching to leave the layers of Al/Ti/TiN only on a region of the insulating layer 35 inclusive of a region over the gate electrode 32, to form an absorber layer 36. Next, a silicon nitride film 37 is deposited on an entire surface inclusive of the absorber layer 36 by chemical vapor deposition. In this instance, an oxide film may be deposited in place of the silicon nitride film 37. And, a first photoresist film (not shown) is coated on the silicon nitride film 37, and selectively patterned by exposure and development, to leave a width of the first photoresist film on the silicon nitride film 37 over the absorber layer 36. Then, the patterned first photoresist film is used as a mask in subjecting the silicon nitride film 37 to anisotropic etching, to form a projection of the silicon nitride film 37 in a relievo form in a region over the absorber layer 36. In this instance, the silicon nitride film 37 is etched to a depth the same as a thickness of the mirror metal layer 40 to be deposited later. The first photoresist film is removed, and a second photoresist film (not shown) is coated on an entire surface of the silicon nitride film 37, and selectively patterned by exposure and development to remove a region thereof over the capacitor electrode 33. The patterned second photoresist film is used as a mask in subjecting the silicon nitride film 37, the insulating layer 36, and the first planar protection film 34 to anisotropic etching, to form a via hole to the capacitor electrode 33. A tungsten layer 38 is deposited by chemical vapor deposition on the silicon nitride film 37 inclusive of the via hole. Then, as shown in FIG. 4B, the tungsten layer 38 is etched back by using a plasma gas, to form a tungsten plug 38a in the via hole. In the plasma etch back of the tungsten layer 38, $SF_6/Ar$ gas is used. The plasma etch back of the tungsten layer 38 causes a loss of the tungsten plug 38a in the via hole in a range of 1500 Å, that in turn causes a problem that the tungsten plug 38a fails to stuff the via hole planar, which results in deterioration of an optical contrast of a mirror metal layer 40 to be formed later. The etch back is made by using the plasma gas in formation of the tungsten plug 38a despite of the problem of planarization, for preventing formation of a residual image caused by damage to the underlying silicon nitride film 37. In order to solve the problem that the tungsten plug 38a fails to stuff the via hole planar, a film with a thickness in a range of 2000~4500 Å is formed of SOG solution in an inorganic group, or FOX solution on an entire surface inclusive of the tungsten plug 38a. The film of SOG or FOX solution is plasma etched back to leave the film only on the lost tungsten plug 38a, to form a planar stuffed layer 39. The planar stuffed layer 39 may be formed by wet etching using plasma etch or chemical solution. In the plasma etch of the film of the SOG or FOX solution, a fluorine-based gas, such as $CHF_3/CF_4$, and $O_2$ are used. And, instead of the film of SOG or FOX solution, an oxide film may be used, which is deposited by chemical vapor deposition. The foregoing steps provide a planar surface in overall except the projection of the silicon nitride film 37 on a region over the absorber layer 36. Then, as shown in FIG. 4C, the mirror metal layer 40 is sputtered on the silicon nitride film 37 inclusive of the planar stuffed layer 39 and the projection of the silicon nitride film 37 to a thickness of 1500~4000 Å. The mirror metal layer 40 is formed of pure aluminum having a high reflection ratio. In this instance, it is difficult to define the gap to be precise and minimum since the scattered reflection of the mirror metal layer 40 of pure aluminum when the mirror metal layer 40 is etched by photo process. Therefore, the projection of a relievo form of the silicon nitride film is formed in advance to a width the same as a required width of the gap for minimizing the gap between the mirror metal layer of pure aluminum. A coat of second planar stuffed protection film 41 is formed of SOG solution in an inorganic group or FOX solution on the mirror metal layer 40 to a thickness in a range of 2000~4500 Å. Since the second planar stuffed protection film 41 is formed of SOG solution in an inorganic group or FOX solution, the second planar stuffed protection film 41 is flat. The second planar stuffed protection film 41 may be a silicon nitride film of oxide film, both are hard masks. Then, as shown in FIG. 4D, the second planar protection film 41 is etched back until the mirror metal layer 40 is exposed. The mirror metal layer 40 is subjected to anisotropic etching (dry etching) using a plasma gas of $Cl_2/BCl_3$, or isotropic etching (wet etching) using a chemical solution, until the projection of the silicon nitride film 37 is exposed. Then, the second planar protection film 41 of the SOG solution in an inorganic group or the FOX solution is removed completely, to isolate the mirror metal layer 40 on both sides of the projection of the silicon nitride film 37. Then, as shown in FIG. 4E, a silicon oxide film $SiO_2$ is deposited on an entire surface inclusive of the mirror metal layer 40, and subjected to photo etching, to form an oxide film spacer 42 over the isolated portion of the mirror metal layer 40, i.e., on the projection of the silicon nitride film 37.

The metal layer in a semiconductor device and method for fabricating the same of the present invention have the following advantages.

First, the etching of the silicon nitride film in a relievo form as much as a required gap of the mirror metal layer in advance permits to form a minimum sized gap, which increases a mirror fill factor, that permits to obtain a high light transmission factor.

Second, the planar mirror metal layer made available by the stuffing of lost portion of the tungsten plug in the via hole with the SOG solution in an inorganic group or the FOX solution can enhance an optical contrast.

Third, the formation of the tungsten plug by using a plasma gas prevents damage to the silicon nitride film, that prevents the problem of residual image formation in a light transmission.

Fourth, the formation of the tungsten plug, not by chemical mechanical polishing, but by etch back using plasma gas, is effective for reducing a production cost.

It will be apparent to those skilled in the art that various modifications and variations can be made in the metal layer in a semiconductor device and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A metal layer in a semiconductor device, the semiconductor device having a transistor and a capacitor electrode formed on a region of a semiconductor substrate, the metal layer comprising:
    a planar protection film on an entire surface of the semiconductor substrate inclusive of the transistor and the capacitor electrode;
    an absorber layer over the planar protection film inclusive of a region over the transistor;
    an insulating film on an entire surface, with a width of projection in a relievo form in a region over the absorber layer;
    a via hole through the planar protection film and the insulating film, to expose a region of the capacitor electrode;
    a tungsten plug and a planar stuffed layer in the via hole;
    a mirror metal layer on the insulating film on both sides of the projection of the insulating film, inclusive of the planar stuffed layer; and,
    an insulating film spacer on the projection of the insulating film and the mirror metal in the vicinity of the projection,
    wherein the plug and the planar stuffed layer comprise different materials.

2. A metal layer as claimed in claim 1, wherein the mirror metal layer has a thickness the same as a height of the projection of the insulating film.

3. A metal layer as claimed in claim 1, wherein the mirror metal layer is formed of aluminum.

4. A metal layer as claimed in claim 1, wherein the insulating film is formed of silicon nitride $Si_3N_4$ or an oxide.

5. A metal layer as claimed in claim 1, wherein the absorber layer is a stack of layers of Al/Ti/TiN.

6. A metal layer as claimed in claim 1, further comprising an oxide film formed between the planar protection film and the absorber layer.

7. A metal layer as claimed in claim 1, wherein the insulating film spacer is formed of silicon oxide film.

8. A metal layer as claimed in claim 1, wherein the planar stuffed layer is formed on a top surface of the plug and a top surface of the planar stuffed layer is substantially coplanar with a top surface of the insulating film.

9. A metal layer in a semiconductor device, the semiconductor device having a transistor and a capacitor electrode formed on a region of a semiconductor substrate, the metal layer comprising:

- a planar protection film on an entire surface of the semiconductor substrate inclusive of the transistor and the capacitor electrode;

- an absorber layer over the planar protection film inclusive of a region over the transistor;

- an insulating film on an entire surface, with a width of projection in a relievo form in a region over the absorber layer;

- a via hole through the planar protection film and the insulating film, to expose a region of the capacitor electrode;

- a tungsten plug and a planar stuffed layer in the via hole;

- a mirror metal layer on the insulating film on both sides of the projection of the insulating film, inclusive of the planar stuffed layer; and,

- an insulating film spacer on the projection of the insulating film and the mirror metal in the vicinity of the projection, wherein the planar stuffed layer is formed of SOG (Spin on Glass) solution in an inorganic group, or FOX (Flowable Oxide), or chemical vapor deposition of an oxide.

* * * * *